United States Patent [19]

Summers

[11] Patent Number: 5,426,071
[45] Date of Patent: Jun. 20, 1995

[54] POLYIMIDE COPOLYMER FILM FOR LIFT-OFF METALLIZATION

[75] Inventor: John D. Summers, Newtown, Pa.

[73] Assignee: E. I. du Pont de Nemours and Company, Wilmington, Del.

[21] Appl. No.: 205,440

[22] Filed: Mar. 4, 1994

[51] Int. Cl.$^6$ ............................................. H01L 21/28
[52] U.S. Cl. ................................. 437/203; 437/944; 427/516; 528/125; 216/40; 216/13
[58] Field of Search ................ 437/203, 944; 148/DI23025; 156/650, 652; 427/487, 516; 528/125

[56] References Cited

U.S. PATENT DOCUMENTS

| | | |
|---|---|---|
| 3,179,630 | 4/1965 | Endrey . |
| 3,179,634 | 4/1965 | Edwards . |
| 3,873,361 | 3/1975 | Franco et al. ................ 117/212 |
| 4,202,914 | 5/1980 | Havas et al. ................ 427/38 |
| 4,539,222 | 9/1985 | Anderson, Jr. et al. ........ 427/88 |
| 4,599,243 | 9/1986 | Sachder et al. ................ 427/38 |
| 4,794,157 | 12/1988 | Berdohe et al. .............. 528/208 |
| 4,886,573 | 12/1989 | Watanabe et al. ............. 156/643 |
| 5,219,977 | 6/1993 | Kreuz ........................... 528/125 |
| 5,240,878 | 8/1993 | Fitzsimmons et al. ......... 437/187 |

FOREIGN PATENT DOCUMENTS

| | | | |
|---|---|---|---|
| 225464 | 6/1987 | European Pat. Off. | 437/944 |
| 276364 | 2/1990 | Germany | 437/944 |
| 60-247948 | 12/1985 | Japan | 437/944 |

*Primary Examiner*—Olik Chaudhuri
*Assistant Examiner*—Ken Herton

[57] ABSTRACT

A polyimide copolymer derived from 2,2-bis(3,4-dicarboxyphenyl)hexafluoropropane dianhydride, oxydiphthalic dianhydride, m-phenylene diamine and 4,4'-oxydianiline, for use as a high-temperature resistant lift-off layer in the fabrication of integrated circuit substrates.

14 Claims, No Drawings

POLYIMIDE COPOLYMER FILM FOR LIFT-OFF METALLIZATION

BACKGROUND OF THE INVENTION

This invention relates to a polyimide copolymer film for use as a lift-off layer in high-temperature metallization of integrated circuit substrates.

In order to achieve higher LSI packing densities and speeds, highly packed multilevel interconnection metallization is very desirable. Generally, the definition of the metallization pattern is accomplished by conventional wet chemical etching techniques. However, fabrication technologies, such as dry etching or lift-off metallization have been developed because the conventional chemical etching technology limits the feature size of the metallization pattern.

Although dry etching is very effective in obtaining fine patterns, dry-etched metallization patterns make it very difficult to produce high performance, multilevel interconnection metallization. The steep, sharp edges of the metallization profile obtained by dry etching results in poor step coverage for subsequently deposited layers.

Polymer lift-off films continue to find increased use in the patterning of relief metal interconnections in wafer (semiconductor) and packaging (high density interconnect) systems. In lift-off metallization, a patterned relief layer of photoresist is first formed on a substrate. A layer of metal for integrated circuit conductor lines is coated over the resist layer and the exposed portions of the substrate. The resist layer is then stripped off and takes with it the overlying metal to leave only the pattern of metal in direct contact with the substrate. The lift-off process takes advantage of the natural undercutting of the resist during high energy exposure such that the developed resist pattern is wider at the bottom than at the top. This profile aids in forming a discontinuity between the portions of metal which are on the substrate surface and the portions which cover the resist. This discontinuity is needed in order to permit the resist stripping solution to attack the unexposed resist and remove it along with the overlying metal.

Lift-off metallization produces fine-featured tapered metallization patterns which are favorable for achieving good step coverage. The most serious drawback of this technology is that the metallization layer must be deposited at low temperatures because of the poor heat resistance of the conventional photoresists, such as polymethyl methacrylate, used as the lift-off layer. This worsens the electrical characteristics of the circuit devices and the yield of the metallization patterns.

U.S. Pat. No. 3,873,361, issued to Franco et al on Mar. 25, 1975, discloses a lift-off method for depositing thin metal films in the fabrication of integrated circuits comprising depositing an organic polymeric material on the integrated circuit substrate and an overlying metal masking layer having openings in the selected pattern. Openings are formed in the polymeric material by reactive sputter etching utilizing the metallic mask as a barrier. The openings in the polymeric layer are aligned with and are laterally wider than the corresponding openings in the metallic masking layer as a consequence of the reactive sputter etching step. Thus, the edge of the openings in the metallic masking layer overhang the edges of the openings in the underlying polymeric layer. The thin metal film is then deposited over the structure and on the surface of the substrate exposed by the openings in the polymeric material. When the polymeric material is removed by application of solvent, the metallic masking layer and the thin metal film above the masking layer "lift-off" to leave the thin metal film deposits in the selected pattern on the substrate without tearing the edges of the desired deposited thin metal film as the unwanted portions of the metal film are lifted off.

U.S. Pat. No. 4,202,914, issued to Havas et al on May 13, 1980, further discloses an improved three-layer lift-off process for depositing thin metal films on an integrated circuit substrate or wafer comprising first covering the substrate or wafer with a first masking layer of an organic polymeric photosensitive material and then depositing a layer of silicon nitride on the first masking layer. The silicon nitride layer is covered by a second masking layer of organic polymeric resist material through which apertures are formed in preselected patterns using standard lithographic masking and etching techniques. The silicon nitride layer is then reactive ion etched with $CF_4$ through the apertures formed in the second masking layer. The second masking layer is removed and the first organic polymeric masking layer is then reactive ion etched with oxygen through the apertures in the silicon nitride layer. The etching of the first organic polymeric masking layer continues until the first masking layer is undercut beyond the edges of the aperture in the silicon nitride layer so that the silicon nitride forms an overhang of the aperture in the first masking layer. The layer of metal film is then evaporated over the entire exposed surface of the structure, including the surface of the silicon nitride layer and the substrate exposed through the apertures. Because of the overhang, a discontinuity is formed between the thin metal film deposited upon the exposed surface of the substrate and that formed upon the outer surface of the silicon nitride layer so that when the first masking layer is dissolved, the metal film deposited upon the substrate is left without any edge tearing between it and the removed portions of the metal film.

The organic polymeric material used as the liftoff layer in the prior art patents must exhibit good adhesion to both the substrate and the silicon nitride layer, be thermally stable and be removable by reactive sputter etching. Preferred materials include Novalac-type phenol-formaldehyde resin and a photosensitive cross-linking agent, polyvinyl cinnamate, polymethyl methacrylate and polyimides such as the reaction product of pyromellitic dianhydride and 4,4'-oxydianiline.

SUMMARY OF THE INVENTION

The present invention relates to a soluble polyimide copolymer film for use as a metallization lift-off layer for integrated circuit substrates consisting essentially of from 25 to 45 mole % of 2,2-bis(3,4-dicarboxyphenyl)-hexafluoropropane dianhydride, and from 55 to 75 mole % of oxydiphthalic dianhydride, based on the total molar amount of dianhydride components; and from 55 to 85 mole % of 4,4'-oxydianiline and from 15 to 45 mole % of m-phenylene diamine, based on the total molar amount of diamine components.

A particularly preferred polyimide copolymer liftoff film of the invention has a thickness of at least 12 microns after baking at 85° C., 150° C. and 230° C. for 30 minutes at each temperature and completely dissolves in N-methylpyrrolidone solvent in less than 10 minutes at 85° C.

A further embodiment of the invention relates to an improved lift-off method for forming a patterned metallic film on a substrate comprising:

a) forming a lift-off layer of a polyimide copolymer, consisting essentially of from 25 to 45 mole % of 2,2-bis(3,4-dicarboxyphenyl)hexafluoropropane dianhydride, from 55 to 75 mole % of oxydiphthalic dianhydride, from 55 to 85 mole % of 4,4'-oxydianiline and from 15 to 45 mole % of m-phenylene diamine, on said substrate;

b) forming a silicon nitride layer, having openings in a preselected pattern, on said lift-off layer, said openings being formed by standard photolithographic processes, followed by CF$_4$ dry etching;

c) etching openings through said lift-off layer extending through to said substrate, wherein said openings are aligned with and are laterally wider than said openings in said silicon nitride layer;

d) depositing a thin metallic film layer onto the surface of said silicon nitride layer and said substrate exposed through said openings; and e) removing said lift-off layer together with said silicon nitride layer with said metallic film deposited thereon, thereby leaving said thin metallic film deposited on said substrate exposed through said openings.

DETAILED DESCRIPTION OF THE INVENTION

The polyimide copolymer lift-off films of the invention are prepared by random copolymerization of from 25 to 45 mole %, preferably 30 to 40 mole %, of 2,2-bis-(3,4-dicarboxyphenyl)hexafluoropropane dianhydride; from 55 to 75 mole %, preferably 60 to 70 mole %, of oxydiphthalic dianhydride; from 55 to 85 mole %, preferably 60 to 80 mole %, of 4,4'-oxydianiline; and from 15 to 45 mole %, preferably 20 to 40 mole %, of m-phenylenediamine.

The polyimide copolymers are generally prepared as described in U.S. Pat. No. 3,179,630 and U.S. Pat. No. 3,179,634, by random copolymerization of substantially equimolar amounts of the aromatic tetracarboxylic dianhydride components and the aromatic diamine components at a polymerization temperature not higher than 175° C., preferably not higher than 90° C., in an inert organic solvent. The aromatic dianhydride and aromatic diamine components can be added either neat, as a mixture or as solutions in the organic solvent or the organic solvent can be added to the components.

Preferred solvents include low molecular weight N,N-dialkylcarboxylamides, particularly N,N-dimethylformamide and N,N-dimethylacetamide. Other solvents which may be used are dimethylsulfoxide, N-methyl-2-pyrrolidone, N-cyclohexyl-2-pyrrolidone, tetramethyl urea, dimethylsulfone, hexamethylphosphoramide, tetramethylene sulfone, diglyme and the like. The solvents can be used alone, in combinations with one another or in combinations with poor solvents such as benzene, benzonitrile, dioxane, etc. The amount of solvent used ranges from 60 to 95 weight % and preferably from 75 to 90 weight % of the poly(amic acid) copolymer solution.

It is not required that the aromatic tetracarboxylic dianhydride and aromatic diamine components be used in absolutely equimolar amounts. In order to adjust the molecular weight, the molar ratio of aromatic tetracarboxylic dianhydride components to aromatic diamine components can range from 0.90 to 1.10.

The aromatic poly(amic acid) copolymer solution prepared as described above contains from 5 to 40 weight %, preferably 10 to 25 weight %, of poly(amic acid) copolymer.

The aromatic poly(amic acid) copolymer is subsequently converted to the polyimide copolymer by a chemical conversion process wherein the poly(amic acid) copolymer solution is either immersed in or mixed with conversion chemicals. The poly(amic acid) copolymer conversion chemicals are tertiary amine catalysts and anhydride dehydrating agents. The preferred dehydrating agent is acetic anhydride and is used in slight molar excess of the amount of amic acid groups in the poly(amic acid) copolymer, typically about 2 to 2.4 moles per equivalent of poly(amic acid) copolymer. A comparable amount of tertiary amine catalyst is usually used.

Besides acetic anhydride, other anhydride dehydrating agents include propionic, butyric, valeric, mixed anhydrides of these with one another and with anhydrides of aromatic monocarboxylic acids, e.g. benzoic acid, naphthoic acid, and the like, and with anhydrides of carbonic acid and formic acids, as well as aliphatic ketenes (ketene and dimethyl ketene). Ketenes may be regarded as anhydrides of carboxylic acids derived from drastic dehydration of the acids.

The preferred tertiary amine catalysts are pyridine and beta-picoline and are used in varying amounts from zero up to several moles per mole of anhydride dehydrating agent. Other useful tertiary amine catalysts include alpha-picoline, 3,4-lutidine, 3,5-lutidine, 4-methylpyridine, 4-isopropylpyridine, N,N-dimethylbenzylamine, isoquinoline and triethylamine.

The poly(amic acid) conversion chemicals react at room temperature or above to convert the poly(amic acid) copolymer to the polyimide copolymer. The chemical conversion reaction preferably occurs at temperatures from 15° to 120° C. with the reaction being very rapid at the higher temperatures and very slow at the lower temperatures.

The polyimide copolymer solution is diluted to precipitate the polyimide copolymer which is then formulated by dissolving in a cosolvent mixture of N-methylpyrrolidone and n-butyrolactane. Once the polyimide copolymer has dissolved in the cosolvents, the solution is filtered through a membrane filter to give a polyimide copolymer solution suitable for conventional spin coating operations. Normally, the total solids content of the solution is adjusted to give the desired layer thickness.

Films are prepared by spin-coating the polyimide copolymer solution onto silicon wafers. The resultant layer thickness depends on the viscosity of the solution, the solids content and the rate of spin-coating. The coatings are baked for 30 minutes each at 85° C., 150° C. and 230° C. The films are liberated from the wafers by acid dissolution of silicon dioxide, rinsed with water and dried.

The polyimide copolymers of this invention can be used advantageously to produce lift-off film layers having thicknesses from 5 to 20 microns.

The polyimide random copolymers of the invention which are derived from 2,2-bis-(3,4-dicarboxyphenyl)-hexafluoropropane dianhydride (6FDA) and oxydiphthalic dianhydride (ODPA) as tetracarboxylic acid dianhydride components and from 4,4'-oxydianiline (ODA) and m-phenylene diamine (MPD) as diamine components, have a unique balance of properties making them ideally suited for use as lift-off layers in high-temperature metallization of integrated circuit substrates.

By careful adjustment of the mole ratio of 6FDA (30 to 40 mole % preferred) in the dianhydride portion of the polyimide copolymer and of MPD (30 to 40 mole % preferred) in the diamine portion of the polyimide copolymer, a polyimide copolymer film can be obtained having unique lift-off property advantages such as solubility in N-methylpyrrolidone solvent; ease of formulating thick, high quality, uniform, clear coatings in a single spin-coating operation; chemical inertness; thermal stability at temperatures up to 480° C.; high glass transition temperatures of greater than 250° C., high mechanical toughness as evidenced by tensile strengths ranging from 85 to 255 MPa and tensile moduli ranging from 2 to 3 GPa; rapid and complete etching using conventional reactive ion plasma processes; low water absorption of less than 3%; and resistance to solvents typically used in photoresist processing and stripping (e.g. ketones, alcohols, ethers, hydrocarbon and aromatic solvents).

The composition range of the invention represents copolymers that possess a balance of properties advantageous for lift-off applications. A 6FDA content of at least about 25 mole percent ensures rapid and quantitative dry etch characteristics. However, 6FDA concentrations above about 45 mole percent render the copolymer sensitive to solvents (e.g. acetone, ethyl acetate, PMA) routinely used to coat and process photoresists. During the liftoff process, these solvents can come in contact with the polyimide liftoff layer by migration through the reactive ion etched barrier layer, resulting in detrimental crazing of the polyimide underlayer.

Introducing MPD into the backbone imparts improved solution stability and coating characteristics to the formulated copolymer. MPD concentrations below about 15 mole percent are ineffective in imparting the required formulation and coating improvements. However, MPD concentrations above about 45 mole percent detrimentally affect other copolymer performance characteristics such as mechanical properties and craze resistance.

A particularly preferred polyimide copolymer liftoff film of the invention has a thickness of at least 12 microns, after spin-coating a copolymer solution onto a silicon wafer at 2000 rpm and baking at 85° C., 150° C. and 230° C. for 30 minutes at each of the three temperatures. Immersion of the coated wafer in N-methylpyrrolidone at 85° C., completely dissolves the coating in less than 10 minutes.

The polyimide copolymer of the invention has application as a lift-off layer in high-temperature metallization of integrated circuit substrates as, for example, particularly described in U.S. Pat. No. 4,202,914 discussed infra. More specifically, an integrated circuit substrate is first coated with at least a 12 microns thick masking layer of polyimide copolymer, as previously described herein, and baked to promote adhesion to the substrate. The substrate may be a semiconductor material or a semiconductor substrate having a surface layer of an electrically insulative inorganic material, such as silicon dioxide. A layer of silicon nitride is then deposited on the outer surface of the polyimide copolymer layer using gaseous plasma deposition techniques. Apertures are subsequently formed in the layer of silicon nitride using standard photolithographic and ion etching techniques. For example, the layer of silicon nitride may be spin-coated with a second masking layer of photoresist material, the second masking layer of photoresist material exposed through a photolithographic mask and developed to remove the portions of the second masking layer which correspond to the desired aperture patterns in the layer of silicon nitride. The silicon nitride layer may then be reactive ion etched using $CF_4$ through the apertures in the second masking layer. The second masking layer of photoresist material then is removed by a suitable solvent. Conforming apertures are then made in the first polyimide copolymer masking layer by reactive ion etching using oxygen plasma. Overetching of the polyimide copolymer masking layer produces an overhang of the silicon nitride layer over the apertures in the polyimide copolymer masking layer. A metallic film layer is then evaporated over the entire exposed surface of the circuit substrate including the area of the surface of the substrate exposed through the apertures in the silicon nitride layer and the polyimide copolymer masking layer. Because of the overhang of the silicon nitride layer, a discontinuity is formed between the metallic film deposited upon the exposed surface of the circuit substrate and that formed upon the outer surface of the silicon nitride layer.

The metallic film may be any metal conventionally used for integrated circuit metallization, e.g. aluminum, aluminum-copper alloys, platinum, palladium, chromium, etc.

Finally, the underlying polyimide copolymer layer is chemically dissolved by immersion in a solvent such as N-methylpyrrolidone to "lift-off" the polyimide copolymer layer and the silicon nitride layer together with unwanted portions of the deposited metallic film and leaving the metal film deposited on the substrate in the preferred pattern. The solvent can be any one which dissolves or swells the polyimide copolymer layer without affecting the deposited metal film layer, such as acetone, isopropanol, methyl ethyl ketone or trichloroethylene.

A particularly preferred polyimide copolymer film of the invention consists essentially of 40 mole % of 2,2-bis(3,4-dicarboxyphenyl)hexafluoropropane dianhydride, 60 mole % of oxydiphthalic dianhydride, 60 mole % of 4,4'-oxydianiline and 40 mole % of m-phenylene diamine and has a superior balance of property and processing characteristics suitable for use as a lift-off layer for fabrication of integrated circuit substrates. A 12 micron thick layer of the polyimide copolymer film, after being spun onto a silicon wafer and baked at 85° C., 150° C. and 230° C. for 30 minutes at each temperature, completely dissolves in 5 minutes in N-methyl pyrrolidone at 85° C.

The following examples serve to illustrate certain embodiments of the herein disclosed invention. These examples should not, however, be construed as limiting the scope of the invention as there are many variations which may be made thereon without departing from the spirit of the disclosed invention, as those of skill in the art will readily recognize.

EXAMPLES 1 TO 5

GLOSSARY

6FDA   2,2-bis(3,4dicarboxyphenyl)hexafluoropropane dianhydride
ODPA oxydiphthalic dianhydride
ODA 4,4'-oxydianiline
MPD m-phenylene diamine
NMP N-methylpyrrolidone Tg glass transition temperature (° C.)
μm micron
GPa giga pascal
MPa mega pascal
kN Kilonewton
BLO gamma-butyrolactone
PMA propylene glycol methyl ether acetate

PROCEDURE

Poly(amic acid) Preparation:

A dry, one-liter, three-neck, round-bottom flask was fitted with an overhead stirrer and a nitrogen inlet. The diamine monomers, ODA and MPD, were added to the flask and 150 g of NMP was added to dissolve the powdered monomers. The solid dianhydrides, ODPA and 6FDA, were weighed and then combined as powders. The dianhydride monomer mixture was then slowly added to the stirring diamine monomer solution. Table I summarizes the amounts of ODPA, 6FDA, ODA and MPD used in the polyimide copolymers of Examples 1 to 5. An additional 70 g of NMP was added to bring the solids level to approximately 20%. Agitation was continued for 15 hours at room temperature to complete the polymerization reaction. The final solution viscosity of the poly(amic acid) solution was approximately 25 poises.

Chemical Imidization and Poller Isolation:

Acetic anhydride (44.10 g, 0.43 mole) was added to the stirring poly(amic acid) solution, followed by 43.71 g (0.43 mole) of triethylamine. Rapid stirring was continued at room temperature for an additional 15 hours to affect cyclodehydration. The final solution viscosity was about 11 poises.

The polyimide copolymer solution was then poured into a rapidly stirring water/methanol (2:1 v/v) solution to isolate the polyimide copolymer. The precipitated copolymer was then filtered, washed with methanol and water, then vacuum dried at 100° C. for 24 hours. The final yield of polyimide copolymer was about 81%.

Film Preparation:

The dried polyimide copolymer was dissolved in a cosolvent mixture of gamma-butyrolactone and NMP (90:10 v/v), then passed through a 1.0 μm Whatman 36HD porous filter to give a stable polyimide copolymer solution, suitable for conventional spin-coating applications.

Films were prepared by spin-coating the polyimide copolymer solutions onto silicon wafers at 2000 rpm for 30 seconds. The coatings were baked at 85° C., 150° C. and 230° C. for 30 minutes at each of the three temperatures. The film coating thickness was measured using a profilometer. Coating thicknesses were 12 microns or greater. Films were subsequently liberated from the wafer substrates by acid dissolution of the silicon dioxide, rinsed with water and then dried.

TESTING METHODS

Coating Quality:

The polyimide copolymer solutions were spun onto silicon wafers at 2000 rpm for 30 seconds. The coated wafers were allowed to set undisturbed for 8 hours at 45% relative humidity and 69° C. If the lift-off coating remained visually clear throughout the 8 hour period it "passed" the coating quality test. If coating clarity was compromised by a "cloudy" appearance, the copolymer precipitated from solution and "failed" the coating quality test.

Mechanical Properties:

Mechanical properties were determined using an Instron Model 4501 Tensile Tester using a 1 kN load cell. Thin film samples of polyimide copolymer were prepared and analyzed according to ASTM D-882-83, Method A and ASTM D-2370-82.

Moisture Absorption:

A quartz microbalance was employed to determine the moisture absorption of cured polyimide copolymer films. The frequency difference generated between a pair of matched quartz wafers (a reference wafer and a sample wafer coated with copolymer) as a function of controlled humidity was correlated with water absorption associated with the copolymer coating.

Glass Transition Temperature (Tg):

The thin film mode of a Rheometrics RSA-II solids analyzer was used to obtain the dynamic mechanical spectra of cured copolymer films. Static pretension of a 100 g film sample and a 0.1% dynamic strain amplitude were used for the measurements. The dynamic tensile modulus and tan delta were measured for a temperature range of 30° to 400° C. Tg's were determined from the peak in the tan delta curves.

Solvent Crazing:

Twelve micron polyimide copolymer coatings were prepared on 5-inch aluminum wafers by spin-coating at 2000 rpm for 30 seconds. The coatings were baked at 85° C., 150° C. and 230° C. for 30 minutes at each of the three temperatures. A 1.5% static strain was induced into the coating by flexing the aluminum wafers 0.5 inch and placing the flexed wafers in an apparatus designed to preserve the arc generated in the wafer. The strained coatings were then submersed for 12 hours in xylene, ethyl acetate, PMA, acetone and anisole solvents. After the 12 hour exposure, the extent of solvent crazing was determined by visual observation with an overhead light microscope.

Solubility (Lift-Off):

Polyimide copolymer solutions were spin-coated onto silicon wafers at 2000 rpm to provide coatings having a thickness of at least 12 microns. The coatings were baked at 85° C., 150° C. and 230° C. for 30 minutes at each temperature. The coated wafers were then immersed in NMP at 85° C. The coating must completely dissolve in less than 10 minutes to be acceptable as a lift-off layer for fabricating circuit substrates.

Table II summarizes the properties for a lift-off layer, the range of such properties according to industrial standards and the properties of the polyimide copolymers of Examples 1 to 5.

TABLE I

COMPOSITION OF 6FDA/ODPA/ODA/MPD POLYIMIDE COPOLYMERS

| MONOMER | EX. 1 | EX. 2 | EX. 3 | EX. 4 | EX. 5 |
|---|---|---|---|---|---|
| ODA | | | | | |
| Weight (g) | 13.2401 | 15.2139 | 13.0476 | 17.4009 | 13.1064 |
| Moles | 0.0661 | 0.0760 | 0.0652 | 0.0869 | 0.0655 |
| Mole % | 60 | 70 | 60 | 80 | 60 |
| MPD | | | | | |
| Weight (g) | 4.7669 | 3.5213 | 4.6976 | 2.3466 | 4.7188 |

TABLE I-continued
COMPOSITION OF 6FDA/ODPA/ODA/MPD POLYIMIDE COPOLYMERS

| MONOMER | EX. 1 | EX. 2 | EX. 3 | EX. 4 | EX. 5 |
|---|---|---|---|---|---|
| Moles | 0.0441 | 0.0326 | 0.0434 | 0.0217 | 0.0436 |
| Mole % | 40 | 30 | 40 | 20 | 40 |
| ODPA | | | | | |
| Weight (g) | 20.1019 | 20.1019 | 23.4511 | 20.1019 | 20.1019 |
| Moles | 0.0648 | 0.0648 | 0.0756 | 0.0648 | 0.0648 |
| Mole % | 60 | 60 | 70 | 60 | 60 |
| 6FDA | | | | | |
| Weight (g) | 19.1908 | 19.1908 | 14.3934 | 19.1908 | 19.1908 |
| Moles | 0.0432 | 0.0432 | 0.0324 | 0.0432 | 0.0432 |
| Mole % | 40 | 40 | 30 | 40 | 40 |
| Stoichiometry (moles dianhydrides/ moles diamines X100) | 98% | 95.5% | 99.5% | 99.5% | 99% |

TABLE II
LIFT-OFF PROPERTIES FOR 6FDA/ODPA/ODA/MPD POLYIMIDE COPOLYMER FILMS

| Property | Preferred Range | Example 1 |
|---|---|---|
| Formulation | BLO/NMP (90/10 ±5%) | 90/10 |
| Solids | 19.0% ±2.5 | 19.7 |
| Viscosity | 140 stokes ±30 | 121 |
| 7 Day Visc. Drift | ±10.0% | 3.1 |
| Water content | ≦1.0% (solution) | 0.37 |
| Coating Thickness | ≧12 μm at 2000 rpm | 16.1 |
| Precipitation (69° C., 45% RH) | no clouding as spun (8 hours) | pass |
| Lift-off time | ≦10 min./12 μm coating | 4.0/16.1 |
| Particle Count | ≦0.048 defects/cm2 | 0.016 |
| Tg | ≧250° C. | 280 |
| Moisture absorption | ≦3.0% | 2.4 |
| Na, K, Li | ≦1.0 ppm each | 0.47, 0.3 |
| Chloride | ≦10 ppm | 0.5 |
| Total Metals | ≦10 ppm | <10 |
| Tensile Modulus | 2-3 GPa | 2.8 |
| Tensile Strength | 85-255 MPa | 167 |
| Elongation | ≧20% | 100 |
| Solvent Crazing | no crazing during 12 hr exposure at 1.5% strain | |
| Xylene | | no crazing |
| Ethyl Acetate | | no crazing |
| PMA | | no crazing |
| Acetone | | no crazing |
| Anisole | | no crazing |
| Residual Stress | ≦40 MPa, 12 μm film | 37 |

| Property | Preferred Range | Example 2 |
|---|---|---|
| Formulation | BLO/NMP (90/10 ±5%) | 90/10 |
| Solids | 19.0% ±2.5 | 16.6 |
| Viscosity | 140 stokes ±30 | 145 |
| 7 Day Visc. Drift | ±10.0% | 1.1 |
| Water content | ≦1.0% (solution) | 0.62 |
| Coating Thickness | ≧12 μm at 2000 rpm | 15 |
| Precipitation (69° C., 45% RH) | no clouding as spun (8 hours) | pass |
| Lift-off time | ≦10 min./12 μm coating | 5.0/15.0 |
| Particle Count | ≦0.048 defects/cm2 | 0.047 |
| Tg | ≧250° C. | 280 |
| Moisture absorption | ≦3.0% | 2.2 |
| Na, K, Li | ≦1.0 ppm each | 0.62, 0.2 |
| Chloride | ≦10 ppm | 0.5 |
| Total Metals | ≦10 ppm | <10 |
| Tensile Modulus | 2-3 GPa | 2.9 |
| Tensile Strength | 85-255 MPa | 170 |
| Elongation | ≧20% | 102 |
| Solvent Crazing | no crazing during 12 hr exposure at 1.5% strain | |
| Xylene | | no crazing |
| Ethyl Acetate | | no crazing |
| PMA | | no crazing |
| Acetone | | no crazing |
| Anisole | | no crazing |
| Residual Stress | ≦40 MPa, 12 μm film | 36 |

| Property | Preferred Range | Example 3 |
|---|---|---|
| Formulation | BLO/NMP (90/10 ±5%) | 90/10 |
| Solids | 19.0% ±2.5 | 19.4 |
| Viscosity | 140 stokes ±30 | 157 |
| 7 Day Visc. Drift | ±10.0% | 5.3 |
| Water content | ≦1.0% (solution) | 0.45 |
| Coating Thickness | ≧12 μm at 2000 rpm | 13.5 |
| Precipitation (69° C. 45% RH) | no clouding as spun (8 hours) | pass |
| Lift-off time | ≦10 min./12 μm coating | 5.0/13.5 |
| Particle Count | ≦0.048 defects/cm2 | 0.031 |
| Tg | ≧250° C. | 277 |
| Moisture absorption | ≦3.0% | 2.5 |
| Na, K, Li | ≦1.0 ppm each | 0.87, 0.4 |
| Chloride | ≦10 ppm | 0.5 |
| Total Metals | ≦10 ppm | <10 |
| Tensile Modulus | 2-3 GPa | 2.8 |
| Tensile Strength | 85-255 MPa | 137 |
| Elongation | ≧20% | 94 |
| Solvent Crazing | no crazing during 12 hr exposure at 1.5% strain | |
| Xylene | | no crazing |
| Ethyl Acetate | | no crazing |
| PMA | | no crazing |
| Acetone | | no crazing |
| Anisole | | no crazing |
| Residual Stress | ≦40 MPa, 12 μm film | 35 |

| Property | Preferred Range | Example 4 |
|---|---|---|
| Formulation | BLO/NMP (90/10 ±5%) | 90/10 |
| Solids | 19.0% ±2.5 | 20.2 |
| Viscosity | 140 stokes ±30 | 154 |
| 7 Day Visc. Drift | ±10.0%; | 4.2 |
| Water content | ≦1.0% (solution) | 0.71 |
| Coating Thickness | ≧12 μm at 2000 rpm | 15 |
| Precipitation (69° C., 45% RH) | no clouding as spun (8 hours) | pass |
| Lift-off time | ≦10 min./12 μm coating | 5.0/15.0 |
| Particle Count | ≦0.048 defects/cm2 | 0.016 |
| Tg | ≧250° C. | 282 |
| Moisture absorption | ≦3.0% | 1.9 |
| Na, K, Li | ≦1.0 ppm each | 0.5, 0.38 |
| Chloride | ≦10 ppm | 0.5 |
| Total Metals | ≦10 ppm | <10 |
| Tensile Modulus | 2-3 GPa | 2.7 |
| Tensile Strength | 85-255 MPa | 148 |
| Elongation | ≧20% | 85 |
| Solvent Crazing | no crazing during 12 hr exposure at 1.5% strain | |
| Xylene | | no crazing |
| Ethyl Acetate | | no crazing |
| PMA | | no crazing |
| Acetone | | no crazing |
| Anisole | | no crazing |
| Residual Stress | ≦40 MPa, 12 μm film | 33 |

| Property | Preferred Range | Example 5 |
|---|---|---|
| Formulation | BLO/NMP (90/10 ±5%) | 90/10 |
| Solids | 19.0% ±2.5 | 19.3 |
| Viscosity | 140 stokes ±30 | 156 |
| 7 Day Visc. Drift | ±10.0% | 1.8 |
| Water content | ≦1.0% (solution) | 0.24 |
| Coating Thickness | ≧12 μm at 2000 rpm | 16.2 |
| Precipitation (69° C., 45% RH) | no clouding as spun (8 hours) | pass |
| Lift-off time | ≦10 min./12 μm coating | 4.0/16.2 |
| Particle Count | ≦0.048 defects/cm2 | 0.031 |
| Tg | ≧250° C. | 278 |

TABLE II-continued

LIFT-OFF PROPERTIES FOR 6FDA/ODPA/ODA/MPD POLYIMIDE COPOLYMER FILMS

| | | |
|---|---|---|
| Moisture absorption | ≦3.0% | 2.4 |
| Na, K, Li | ≦1.0 ppm each | 0.32, 0.4 |
| Chloride | ≦10 ppm | 0.5 |
| Total Metals | ≦10 ppm | <10 |
| Tensile Modulus | 2–3 GPa | 2.9 |
| Tensile Strength | 85–255 MPa | 179 |
| Elongation | ≧20% | 109 |
| Solvent Crazing | no crazing during 12 hr exposure at 1.5% strain | |
| Xylene | | no crazing |
| Ethyl Acetate | | no crazing |
| PMA | | no crazing |
| Acetone | | no crazing |
| Anisole | | no crazing |
| Residual Stress | ≦40 MPa, 12 μm film | 38 |

What is claimed is:

1. A soluble polyimide copolymer film for use as a metallization lift-off layer for integrated circuit substrates consisting essentially of from 25 to 45 mole % of 2,2-bis(3,4-dicarboxyphenyl)hexafluoropropane dianhydride, and from 55 to 75 mole % of oxydiphthalic dianhydride, based on the total molar amount of dianhydride components; and from 55 to 85 mole % of 4,4'-oxydianiline and from 15 to 45 mole % of m-phenylene diamine, based on the total molar amount of diamine components.

2. The polyimide copolymer lift-off film of claim 1 having a thickness of at least 12 microns after baking at 85° C., 150° C. and 230° C. for 30 minutes at each temperature and which completely dissolves in N-methylpyrrolidone solvent in less than 10 minutes at 85° C.

3. The polyimide copolymer lift-off film of claim 2 consisting essentially of from 30 to 40 mole % of 2,2-bis(3,4-dicarboxyphenyl)hexafluoropropane dianhydride, from 60 to 70 mole % of oxydiphthalic dianhydride, from 20 to 40 mole % of m-phenylene diamine and from 60 to 80 mole % of 4,4'-oxydianiline.

4. The polyimide copolymer lift-off film of claim 3 consisting essentially of 40 mole % of 2,2-bis(3,4-dicarboxyphenyl)hexafluoropropane dianhydride, 60 mole % of oxydiphthalic dianhydride, 40 mole % of m-phenylene diamine and 60 mole % of 4,4'-oxydianiline.

5. The polyimide copolymer lift-off film of claim 3 consisting essentially of 40 mole % of 2,2-bis(3,4dicarboxyphenyl)hexafluoropropane dianhydride, 60 mole % of oxydiphthalic dianhydride, 30 mole % of m-phenylene diamine and 70 mole % of 4,4'-oxydianiline.

6. The polyimide copolymer lift-off film of claim 3 consisting essentially of 30 mole % of 2,2-bis(3,4-dicarboxyphenyl)hexafluoropropane dianhydride, 70 mole % of oxydiphthalic dianhydride, 40 mole % of m-phenylene diamine and 60 mole % of 4,4'-oxydianiline.

7. The polyimide copolymer lift-off film of claim 3 consisting essentially of 40 mole % of 2,2-bis(3,4dicarboxyphenyl)hexafluoropropane dianhydride, 60 mole % of oxydiphthalic dianhydride, 20 mole % of m-phenylene diamine and 80 mole % of 4,4'-oxydianiline.

8. A lift-off method for forming a patterned metallic film on a substrate comprising:
   a) forming a lift-off layer of a polyimide copolymer, consisting essentially of from 25 to 45 mole % of 2,2-bis(3,4-dicarboxyphenyl)hexafluoropropane dianhydride, from 55 to 75 mole % of oxydiphthalic dianhydride, from 55 to 85 mole 20 % of 4,4'-oxydianiline and from 15 to 45 mole % of m-phenylene diamine, on said substrate;
   b) forming a silicon nitride layer, having openings in a preselected pattern, on said lift-off layer;
   c) etching openings through said lift-off layer extending through to said substrate, wherein said openings are aligned with and are laterally wider than said openings in said silicon nitride layer;
   d) depositing a thin metallic film layer onto the surface of said silicon nitride layer and said substrate exposed through said openings; and
   e) removing said lift-off layer together with said silicon nitride layer with said metallic film deposited thereon, thereby leaving said thin metallic film deposited on said substrate exposed through said openings.

9. The lift-off method of claim 8 wherein said polyimide copolymer lift-off layer has a thickness of at least 12 microns after baking at 85° C., 150° C. and 230° C. for 30 minutes at each temperatures and completely dissolves in N-methyl pyrrolidone solvent in less than 10 minutes at 85° C.

10. The lift-off method of claim 8 wherein said lift-off layer is removed by immersion in an organic solvent.

11. The lift-off method of claim 8 wherein said etching is reactive ion etching using oxygen as a reactive gas.

12. The lift-off method of claim 8 wherein said substrate is a semiconductor substrate.

13. The lift-off method of claim 8 wherein said substrate is a metallic oxide.

14. The lift-off method of claim 8 wherein said substrate is silicon dioxide.

* * * * *